United States Patent
Pawlowski et al.

(10) Patent No.: US 12,442,759 B2
(45) Date of Patent: Oct. 14, 2025

(54) CONTAMINANT ANALYZING METROLOGY SYSTEM, LITHOGRAPHIC APPARATUS, AND METHODS THEREOF

(71) Applicants: ASML Holding N.V., Veldhoven (NL); ASML Netherlands B.V., Veldhoven (NL)

(72) Inventors: Michal Emanuel Pawlowski, Norwalk, CT (US); Aage Bendiksen, Fairfield, CT (US); Christopher Michael Dohan, Redding, CT (US); Johannes Onvlee, 's-Hertogenbosch (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 97 days.

(21) Appl. No.: 17/918,317

(22) PCT Filed: Apr. 1, 2021

(86) PCT No.: PCT/EP2021/058739
§ 371 (c)(1),
(2) Date: Oct. 11, 2022

(87) PCT Pub. No.: WO2021/209273
PCT Pub. Date: Oct. 21, 2021

(65) Prior Publication Data
US 2023/0137537 A1    May 4, 2023

Related U.S. Application Data

(60) Provisional application No. 63/010,353, filed on Apr. 15, 2020.

(51) Int. Cl.
*G01N 21/31* (2006.01)
*G01N 21/956* (2006.01)
*G03F 7/00* (2006.01)

(52) U.S. Cl.
CPC ........... *G01N 21/31* (2013.01); *G01N 21/956* (2013.01); *G03F 7/7085* (2013.01)

(58) Field of Classification Search
CPC .... G01N 21/31; G01N 21/956; G03F 7/7065; G03F 7/7085
See application file for complete search history.

(56) References Cited

U.S. PATENT DOCUMENTS

| | | | |
|---|---|---|---|
| 5,798,831 | A | 8/1998 | Hagiwara |
| 7,511,799 | B2 | 3/2009 | Tel et al. |

(Continued)

FOREIGN PATENT DOCUMENTS

| | | |
|---|---|---|
| CN | 102597890 A | 7/2012 |
| CN | 102636963 A | 8/2012 |

(Continued)

OTHER PUBLICATIONS

International Search Report and Written Opinion of the International Searching Authority directed to related International Patent Application No. PCT/EP2021/058739, mailed Jul. 12, 2021; 12 pages.

(Continued)

*Primary Examiner* — Maurice C Smith
(74) *Attorney, Agent, or Firm* — Sterne, Kessler, Goldstein &Fox P.L.L.C.

(57) ABSTRACT

An inspection system, a lithography apparatus, and an inspection method are provided. The inspection system includes an illumination system, a detection system, and processing circuitry. The illumination system generates a broadband beam and illuminates surface of an object with the broadband illumination beam. The broadband beam has a continuous spectral range. The detection system receives radiation scattered at the surface and by a structure near the surface. The detection system generates a detection signal (Continued)

based on an optical response to the broadband illumination beam. The processing circuitry analyzes the detection signal. The processing circuitry distinguishes between a spurious signal and a signal corresponding to a defect on the surface based on the analyzing. The spurious signal is diminished for at least a portion of the continuous spectral range.

21 Claims, 14 Drawing Sheets

(56) References Cited

U.S. PATENT DOCUMENTS

| | | | |
|---|---|---|---|
| 10,861,145 B2* | 12/2020 | Honda | ............... G01N 21/8851 |
| 2001/0030296 A1 | 10/2001 | Ishimaru et al. | |
| 2004/0207836 A1 | 10/2004 | Chhibber et al. | |
| 2006/0001864 A1 | 1/2006 | Kanzaki et al. | |
| 2006/0072108 A1 | 4/2006 | Onvlee et al. | |
| 2007/0091325 A1 | 4/2007 | Nikoonahad | |
| 2015/0062581 A1* | 3/2015 | Urano | ................ G01N 21/9501 |
| | | | 356/366 |
| 2020/0096862 A1* | 3/2020 | Tolani | ....................... G03F 1/74 |

FOREIGN PATENT DOCUMENTS

| | | | | |
|---|---|---|---|---|
| CN | 109075091 A | | 12/2018 | |
| CN | 110579479 A | * | 12/2019 | ......... G01N 21/8851 |
| EP | 1 016 126 A2 | | 7/2000 | |
| KR | 2009064024 A | * | 6/2009 | ........... G03F 7/7085 |
| WO | WO 98/44330 A2 | | 10/1998 | |
| WO | WO-2008141064 A1 | * | 11/2008 | ............... G03F 1/84 |
| WO | WO-2019011552 A1 | * | 1/2019 | ......... G03F 7/70133 |

OTHER PUBLICATIONS

Chinese Office Action directed to Chinese Patent Application No. 202180028075.9, mailed May 1, 2015; 24 pages.

* cited by examiner

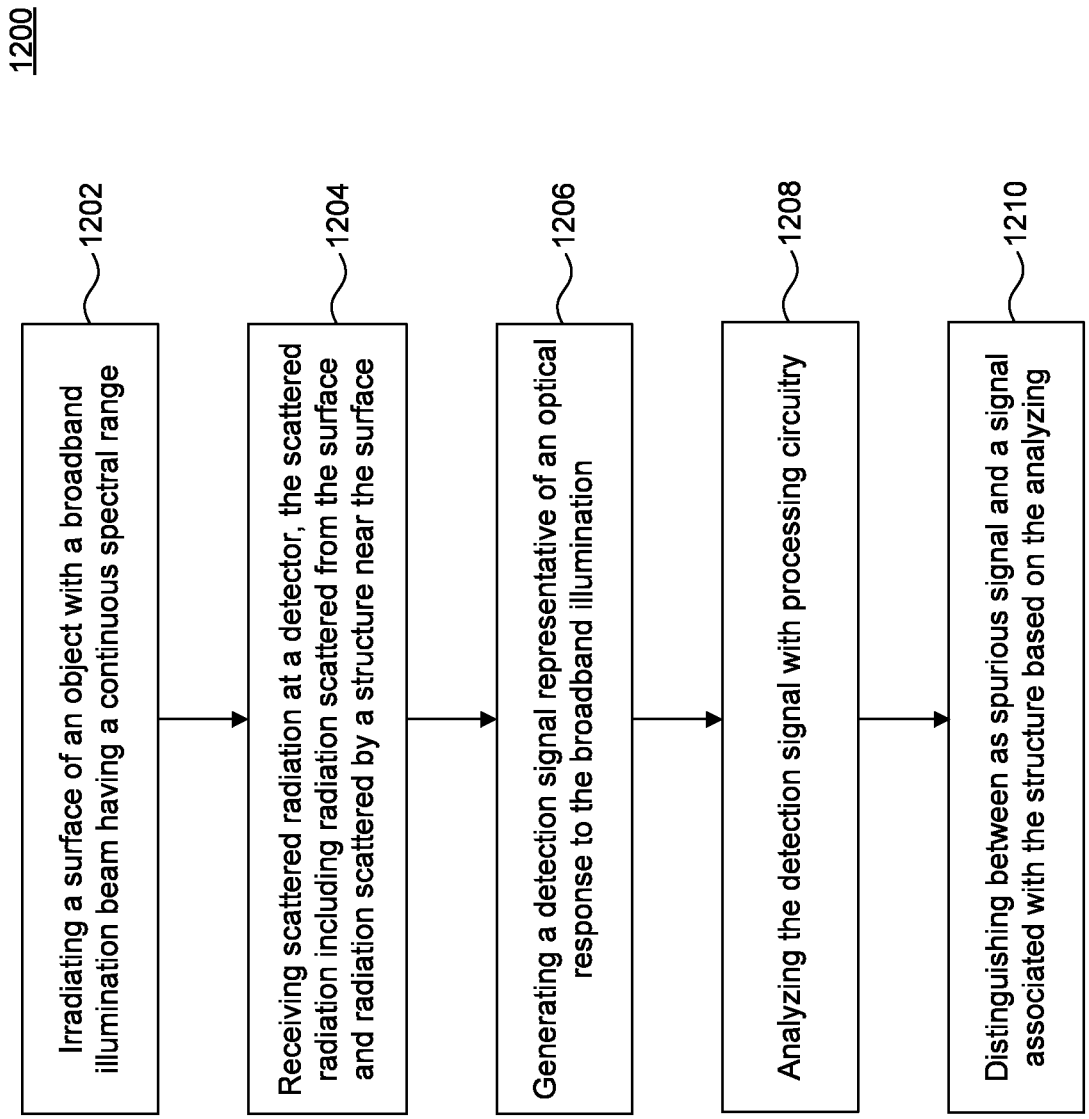

CONTAMINANT ANALYZING METROLOGY SYSTEM, LITHOGRAPHIC APPARATUS, AND METHODS THEREOF

CROSS-REFERENCE TO RELATED APPLICATIONS

This application claims priority of U.S. Provisional Patent Application No. 63/010,353, which was filed on Apr. 15, 2020, and which is incorporated herein in its entirety by reference.

FIELD

The present disclosure relates to lithographic systems, for example, inspection systems for detecting contaminants on a reticle in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"—direction) while synchronously scanning the target portions parallel or anti-parallel to this scanning direction. It is also possible to transfer the pattern from the patterning device to the substrate by imprinting the pattern onto the substrate.

During lithographic operation, different processing steps may require different layers to be sequentially formed on the substrate. Sequencing of layers is typically accomplished by exchanging different reticles, according to the desired pattern for each layer, for each pattern transfer process.

A typical lithographic system works within sub-nanometer tolerances regarding patterns on the reticle and patterns transferred onto the wafer from the reticle. Within the environment of the lithographic apparatus, highly dynamic processes take place, e.g., reticle hand-off, wafer hand-off, controlled gas flows, outgassing of vacuum chamber walls, liquid dispensing (e.g., photoresist coating), temperature variations, metal deposition, rapid movement of numerous actuatable components, and wear of structures. Over time, dynamic processes introduce and build up contaminant particles within the lithographic apparatus. A contaminant particle on a reticle may introduce errors to transferred patterns. Therefore, it is desirable to maintain contaminant-free reticles capable of accurately transferring patterns onto wafers with sub-nanometer accuracy while minimizing false positive detection.

SUMMARY

There is a need to provide improved inspection techniques to detect contaminants on optically critical components of a lithographic apparatus.

In some embodiments, a system comprises an illumination system, a detection system, and processing circuitry. The illumination system generates a broadband beam and illuminates a surface of an object with the broadband illumination beam. The broadband beam has a continuous spectral range. The detection system receives radiation scattered at the surface and by a structure near the surface. The detection system generates a detection signal based on an optical response to the broadband illumination beam. The processing circuitry analyzes the detection signal. The processing circuitry distinguishes between a spurious signal and a signal corresponding to a defect on the surface based on the analyzing. The spurious signal is diminished for at least a portion of the continuous spectral range In some embodiments, a method comprises irradiating a surface of an object with a broadband illumination beam having a continuous spectral range, receiving scattered radiation at a detector, the scattered radiation including radiation scattered from the surface and radiation scattered by a structure near the surface, generating a detection signal representative of an optical response to the broadband illumination signal based on the received scattered radiation, analyzing the detection signal, and distinguishing between a spurious signal and a signal corresponding to a defect on the surface based on the analyzing, wherein the spurious signal is diminished for at least a portion of the continuous spectral range.

In some embodiments, a lithographic apparatus comprises an illumination apparatus, a projection system, and a metrology system. The metrology system comprises an illumination system, a detection system, and a processor. The illumination system generates a broadband beam and illuminates a surface of an object with the broadband illumination beam. The broadband beam has a continuous spectral range. The detection system receives radiation scattered at the surface and by a structure near the surface. The detection system generates a detection signal based on an optical response to the broadband illumination beam. The processing circuitry analyzes the detection signal. The processing circuitry distinguishes between a spurious signal and a signal corresponding to a defect on the surface based on the analyzing. The spurious signal is diminished for at least a portion of the continuous spectral range.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

FIG. 12 shows a flow diagram of an inspection method, according to some embodiments.

Figure 1A:
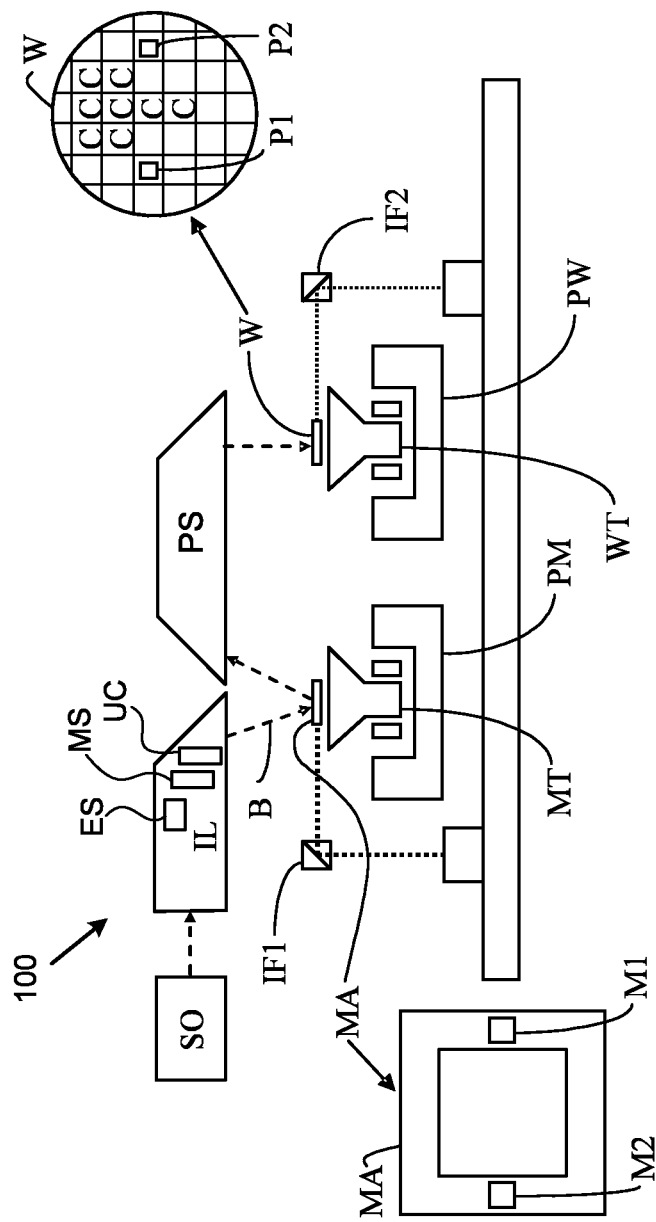
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc. The term "non-transitory" may be used herein to characterize computer readable media used for storing data, information, instructions, and the like, with the sole exception being a transitory, propagating signal.

Before describing such embodiments in more detail, however, it is instructive to present an example environment in which embodiments of the present disclosure can be implemented.

Example Lithographic Systems

Figure 1B:
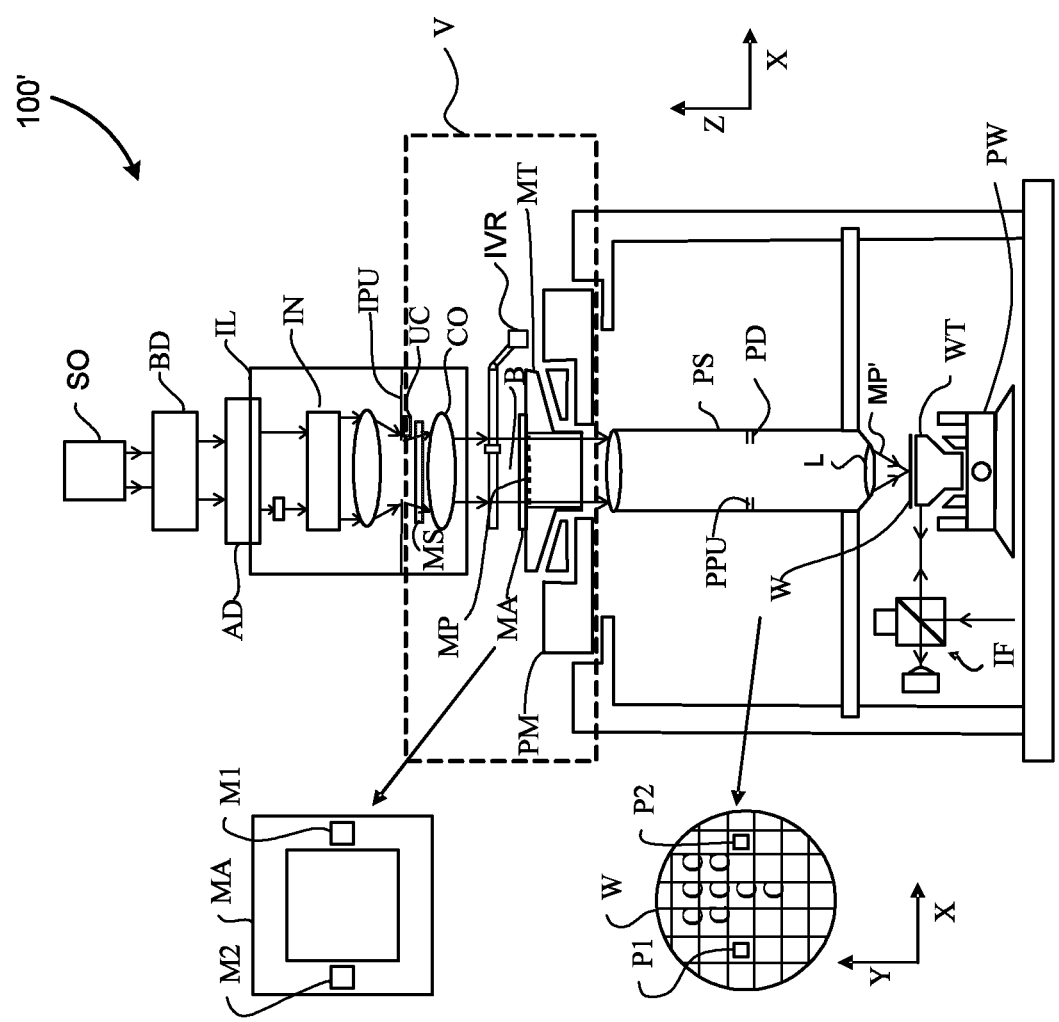
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-) magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In some embodiments, a lithographic apparatus may generate DUV and/or EUV radiation. For example, lithographic apparatus 100' may be configured to operate using a DUV source. In another example, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
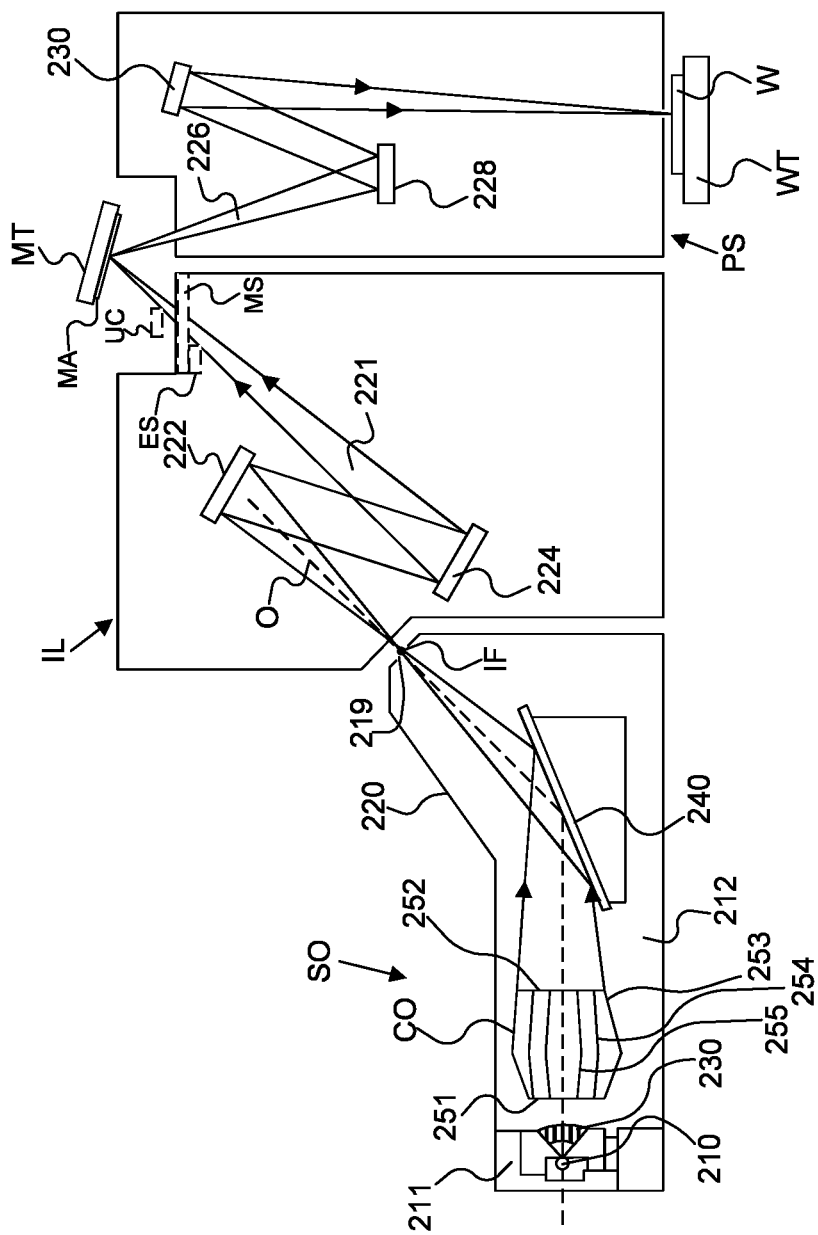
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
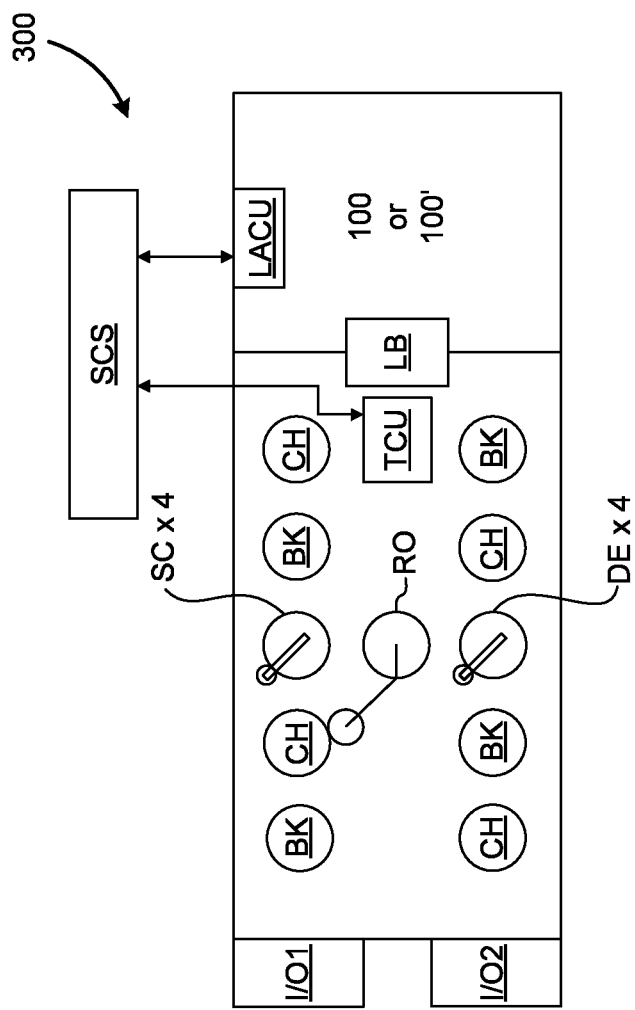
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Contaminant Inspection Apparatus

In some embodiments, a metrology system may be used to inspect an object in order to determine a cleanliness of the object. Inspection techniques may be performed such that undesirable defects on a surface (e.g., a surface of a reticle or substrate) are successfully detected while minimizing false detections (or false positives). Inspection techniques may comprise optical inspection.

The term "imperfection," "defect," "blemish," and the like may be used herein to refer to deviations or non-uniformities of structures from a specified tolerance. For example, a flat surface may have defects such as scratches, holes, or recesses, foreign particles, stains, and the like.

In the context of imperfections, the terms "foreign particle," "contaminant particle," "contaminant," and the like may be used herein to refer to unexpected, atypical, undesirable, or the like (herein undesirable) particulate matter that is present in a region or on a surface that was not designed to tolerate the presence of the undesirable particulate matter or otherwise adversely impacts operation of the apparatus on which the particulate matter is present. Some examples of foreign particles may include dust, stray photoresist, or other dislodged materials within the lithographic apparatus. Examples of dislodged materials may include steel, Au, Ag, Al, Cu, Pd, Pt, Ti, and the like. Material dislodging may occur due to, e.g., processes of fabricating metal interconnects on substrates and friction and impacts of actuated structures. Contaminants may make their way onto sensitive parts in the lithographic apparatus (e.g., reticle or substrate) and increase the likelihood of errors in lithographic processes. Embodiments of the present disclosure provide structures and functions for detecting defects on sensitive parts of a lithographic apparatus or process.

False positives are detrimental to lithography. For example, a false positive detection may slow down production by unnecessarily prompting a maintenance action (e.g., reticle replacement) or even recommending discarding a perfectly conforming reticle. Several solutions are under consideration in the industry to improve the precision and accuracy of particle size measurement, however, such solutions (e.g., multi direction illumination, multi imaging techniques involving polarization) may not provide sufficient attenuation of false positive rate since patterns printed on a reticle are not known. Embodiments of the present disclosure provide structures and functions for reducing instances or eliminating false positives.

Figure 4:
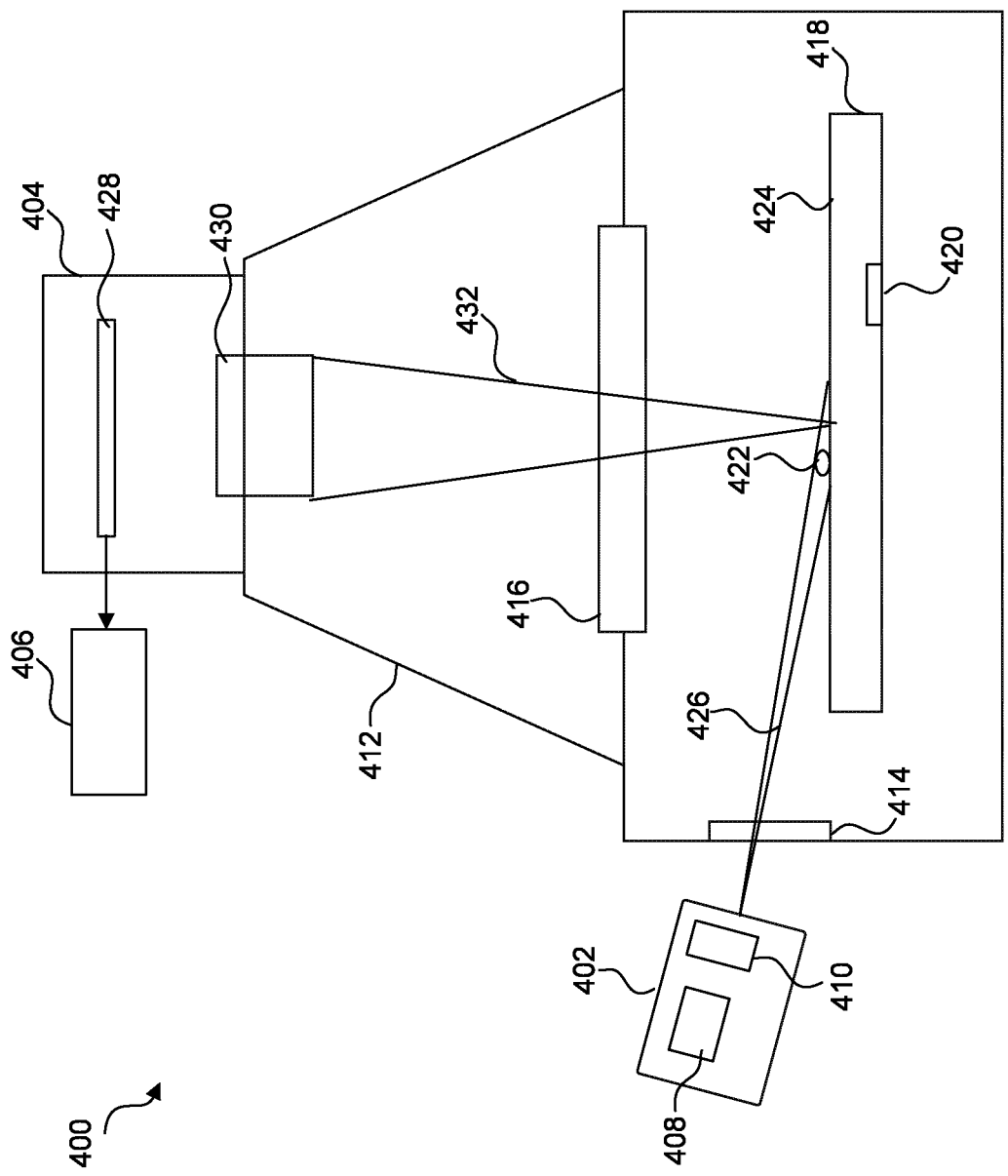
FIG. 4 shows a schematic of a particle inspection system, according to some embodiments.

FIG. 4 shows a schematic of a particle inspection system 400, according to some embodiments. In some embodiments, particle inspection system 400 may be implemented in a lithographic apparatus. Particle inspection system 400 may comprise an illumination system 402, a detection system 404, and a processor 406. Illumination system 402 may comprise a radiation source 408. Illumination system 402 may comprise one or more radiation adjusting elements 410 (e.g., any of polarizers, wavelength filters, focusing elements, beam splitters, beam combiners, and the like).

Particle inspection system 400 may comprise an enclosure 412. Enclosure 412 may comprise one or more compartments. Enclosure 412 may comprise viewport windows 414 and 416.

Before describing embodiments of particle inspection system 400 in more detail, however, it is instructive to present examples of an object that may be inspected using the particle inspection system 400. In some embodiments, object may be a reticle 418. Reticle 418 may comprise pattern features 420. Pattern features 420 may comprise, for example, product and alignment mark patterns to be transferred onto a substrate via a lithographic process. A foreign particle 422 on surface 424 of reticle 418 may negatively impact lithography, since a foreign particle may print through or otherwise distort a shape of reticle 418 when the foreign particle is sandwiched between reticle 418 and a reticle table, or cause damage to the reticle or reticle table surfaces when sandwiched between them, or transfer to the reticle table and thus contaminate it and potentially contaminate or damage other reticles loaded on the same stage.

In some embodiments, radiation source 408 may generate a beam of radiation 426 to illuminate reticle 418. Beam of radiation 426 may comprise a broadband beam across a continuous spectral range (e.g., a broad bandwidth). In other words, radiation source 408 may be a white light source. For example, the continuous spectral range may cover the visible spectrum, ultraviolet-visible spectrum, or ultraviolet-visible-infrared spectrum). One or more radiation adjusting elements 410 (e.g., wavelength filters) may be used to select wavelengths to be used for illuminating reticle 418. Additionally or alternatively, radiation source 408 may comprise two or more broadband radiation sources to generate distinct portions of the broadband spectrum (e.g., a first radiation source in the visible spectrum from about 400 nm to about 900 nm and a second radiation source in the UV spectrum from about 225 nm to about 400 nm)). Radiation source 408 includes a broadband source such as for example an incandescent bulb, a natural source (e.g., sunlight), a light emitting diode (LED) emitting in broadband spectrum, a tunable laser, a xenon lamp or a supercontinuum laser.

In some embodiments, the detection system 404 may comprise a sensor element 428 and a focusing element 430 (e.g., an objective lens or lens system). In some embodiments, detection system 404 may be a single-cell photo-detector (without more, may not be able to resolve an image), in which case sensor element 428 may be a photo-sensitive diode. However, a single-cell photo-detector may be desirable in instances where size, ease of assembly, and/or cost-efficiency are appreciable factors. In one example, an area of interest on surface 424 of reticle 418 may be scanned. The detection system 404 may have a detection range from ultraviolet to near infrared.

In some embodiments, detection system 404 may be an image capture device or a multi-cell photo-detector (e.g., two dimensional array of photo-detectors). Sensor element 428 may comprise a charge-coupled device (CCD) or a complementary metal-oxide-semiconductor (CMOS). Detection system 404 may include a plurality of sensor elements or detectors to cover the continuous spectral range and/or extend field of view of detection system 404. For example, plurality of sensor elements may include a GaN detector and an InGaAs detector. Detection system 404 may have a spectral range overlapping with the continuous spectral range.

In some embodiments, the detection system 404 may be a wavelength sensitive detection system. The detection system 404 may include a spectrometer or a color camera. An inspection system using a wavelength sensitive detection system is shown and described in FIG. 8.

In some embodiments, the detection system 404 may be a wavelength insensitive detection system. An inspection system using a wavelength insensitive detection system is shown and described in FIG. 9.

In some embodiments, the detection system 404 may receive radiation, represented by detected radiation 432, scattered at surface 424 and by structures near the surface (e.g., pattern features 420). Detected radiation 432 scattered at surface 424 may include radiation scattered by particle 422 that is disposed on surface 424. Detection system 404 may generate a detection signal based on the received radiation. The detection signal may comprise information of the received radiation, for example, intensity, phases, and the like.

Processor 406 may receive and analyze the detection signal. Processor 406 may distinguish between a spurious signal and a signal corresponding to a presence of particle 422 on surface 424 based on the analyzing and an intensity profile of the a beam of radiation or illumination beam. That is, particle inspection system 400 is capable of discriminating between two types of detected radiation: (1) radiation associated with particle 422 (e.g., true detection of a foreign particle) and (2) radiation associated with structures other than particle 422 (e.g., false positive due to a spurious signal from radiation scattered by pattern features 420).

In the context of detection of radiation, the terms "false," "spurious," "ghost," "parasitic," and the like may be used to describe signals associated with radiation that does not interact with a foreign particle.

In some embodiments, the distinguishing performed by processor 406 may comprise determining a binary presence (e.g., present or not present) of particle 422. In some embodiments, the distinguishing performed by processor 406 may comprise determining a degree of confidence (e.g., a percentage probability) to a potential presence of particle 422. Processor 406 may present detection results to a user of particle inspection system 400 (e.g., on a computer display). Detection results may comprise, for example, any of presence, position, and/or size of particle 422, captured images, spectral analysis, and the like.

Although specific embodiments have been described in the context of detecting foreign particles (e.g., particle 422), the embodiments described herein are not limited to particulate contamination detection. In some embodiments, the particle inspection systems described herein may detect imperfections in general such as scratches, holes, or recesses, foreign particles, stains, and the like. It is desirable to detect all types of imperfections that pose a risk of disrupting lithographic processes.

Figure 5:
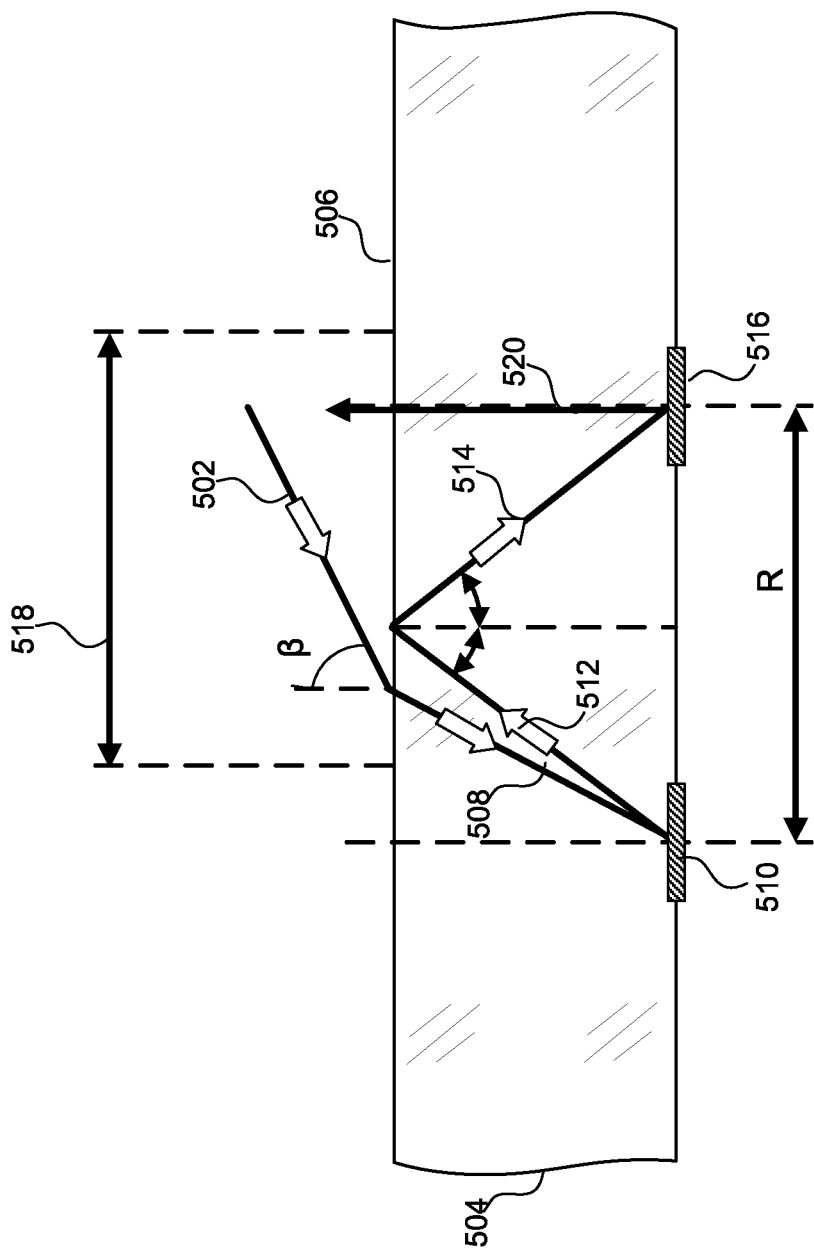
FIG. 5 shows signals reflected from a diffractive pattern, according to some embodiments.

FIG. 5 shows signals reflected from a diffractive pattern, according to some embodiments.

One aspect is discussed here. An illumination beam 502 is incident on lithographic patterning device 504 (e.g., reticle) at an angle β. Lithographic patterning device 504 includes a first diffractive structure 510 and a second diffractive structure 516 spaced by a distance R. Illumination beam 502 is refracted at a first surface 506 of the lithographic patterning device 504 (e.g., reticle). Refracted ray 508 is redirected by first diffractive structure 510 towards the first surface 506 following path 512. Light is reflected at interface glass-air toward second diffractive structure 516. The reflected light follows path 514 and is redirected by second diffractive structure 516 toward the first surface 506. The reflected light exits the lithographic patterning device 504 into a field of view (FOV) 518 of a detection system of the inspection system by way of path 520. The reflected light illustrates an exemplary generation of a ghost signal. However, other mechanisms such as multiple reflection diffraction in one plane or three dimensional reflections/refractions also generate ghost signals.

Reflections such as illustrated by light following paths 508, 512, 514, and 520 can cause a false positive detection in which a detector having FOV 518 may determine that a particle is present, when it is not, or a case of falsely detecting multiple particles.

In one aspect, in order to couple illumination beam 502 into the detection system through paths (508, 512, 514, and 520) light has to go through series of two diffractive events and at least one reflection from glass-air interface. Two diffractive structures separated by distance R are printed on the lithographic patterning device (e.g., reticle). The period between diffractive structures, (e.g., between diffractive structures 510, 516) is configured for a discrete illumination wavelength and illumination direction in order for the light to follow paths 508, 512, 514, and 520. In other words, reflections that cause false positive detection can be wavelength dependent (wavelength sensitive) and can be diminished for other wavelengths. It should be noted that due to cyclic nature of diffraction phenomena, multiple diffractive orders may meet coupling condition. However, reflections due to the first few diffractive orders can be the most significant because diffraction efficiency typically decreases with order number.

In one aspect, an analogous mechanism is responsible for false positives when inspecting a pellicle front side (in that case light instead of traveling in glass would travel through air gap between reticle pattern and pellicle).

Figure 6:
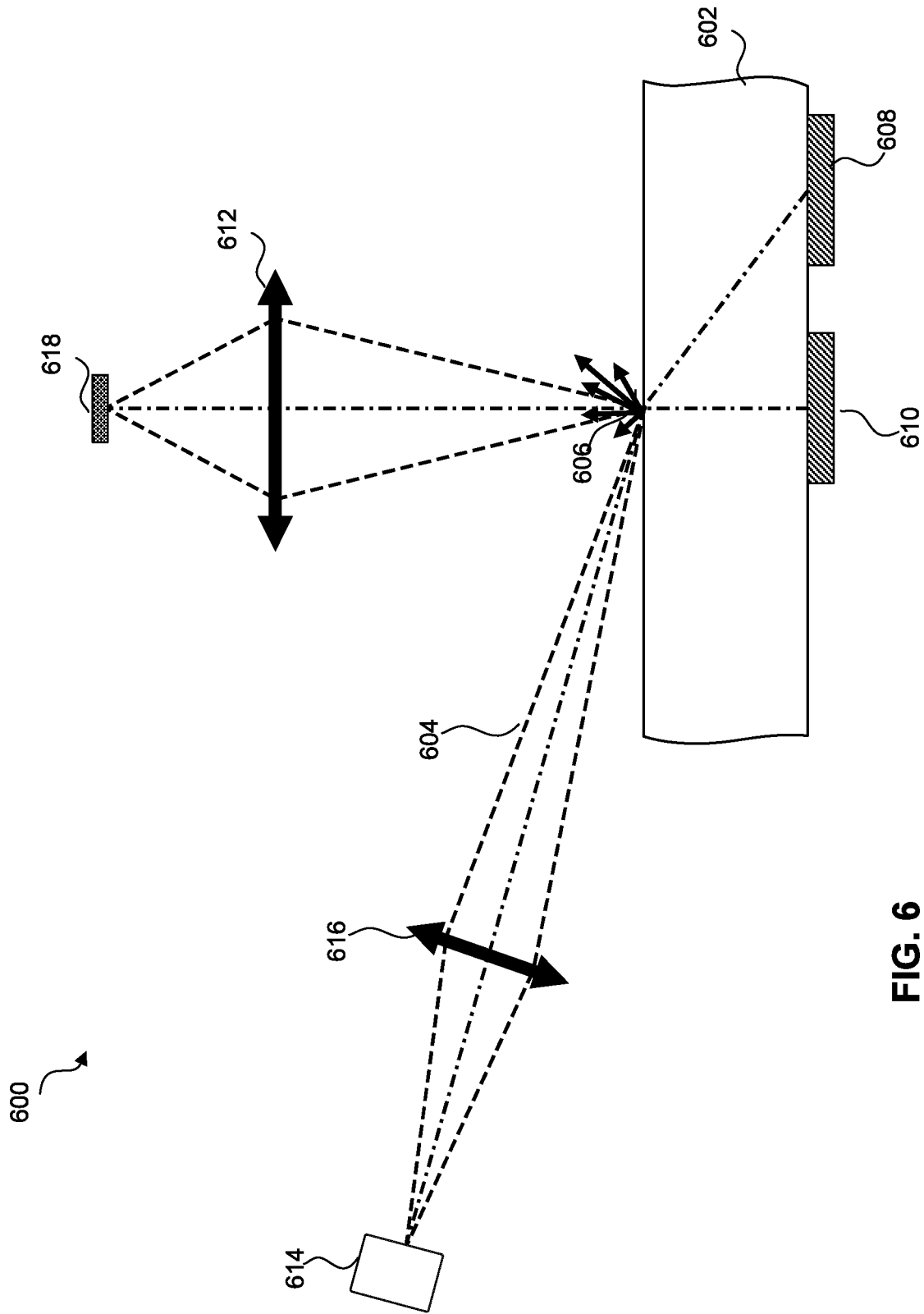
FIG. 6 shows signals reflected from a particle and signals reflected from a diffractive pattern, according to some embodiments.

FIG. 6 shows signals reflected from a particle and signals reflected/scattered from a diffractive pattern in a particle inspection system 600, according to some embodiments. In some aspects, there may be little control of how an illumination system can control how illumination light penetrates a lithographic patterning device, and pellicle-pattern cavity.

For example, as illustrated in FIG. 6 a lithographic patterning device 602 receives an illumination beam 604 for inspection purposes to inspect the existence of a particle 606 on a surface of the lithographic patterning device 602. Lithographic patterning device can include an illumination system 616 comprising a light source 614. Illumination system can generate the illumination beam 604. Particle 606 may be located on a glass side of lithographic patterning device 602, and a first diffractive pattern (structure) 608 and a second diffractive pattern 610 may be located on a front side of lithographic patterning device 602. In one aspect, light entering lithographic patterning device 602 also reaches first diffractive pattern 608 on a front side of the lithographic patterning device and is reflected back to detection system 612. The detection system 612 can include a sensor element 618. Illumination beam 604 irradiates the diffractive pattern and light diffracted from it after reflection from the back surface is ultimately redirected into the detection system 612 and detected as a presence of a contaminant (false positive).

Figure 7A:
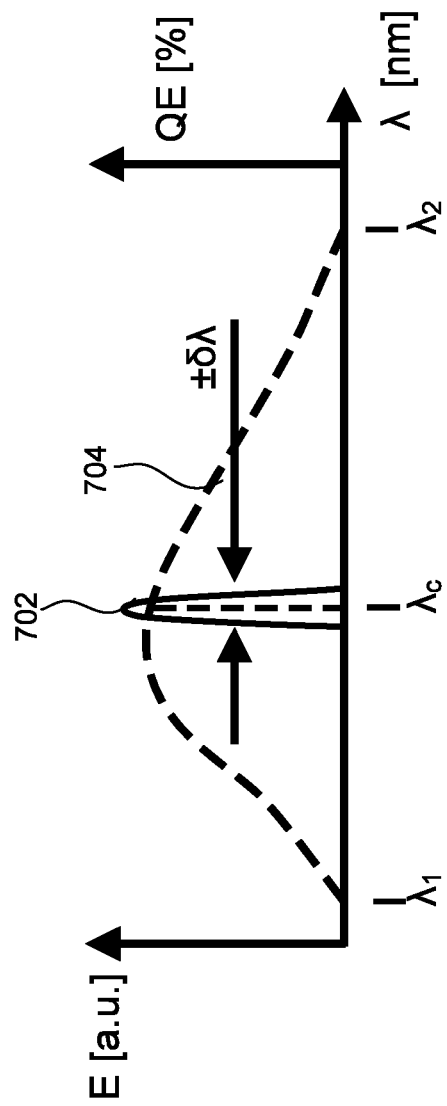
FIG. 7A shows a light emission and a detector spectral characteristic, according to some embodiments.

In some embodiments, illumination beam 604 may have a narrow band profile as illustrated in FIG. 7A. FIG. 7A shows a light emission profile 702 and a detector spectral characteristic profile 704, according to some embodiments. Light emission profile 702 is for a narrowband source having a wavelength $\lambda_c$. Light emission profile 702 is centered at $\lambda_c$. Detection system 612 of FIG. 6 may have spectral characteristic profile 704. Detection system 612 may have a detection range from a first wavelength $\lambda_1$ to a second wavelength $\lambda_2$.

Referring back to FIG. 6, a signal from particle 602 can be described by:

$$I_{particle} = \int_{\lambda_c-\delta\lambda}^{\lambda_c+\delta\lambda} E(\lambda) \times R_p \times G_d \times QE(\lambda) \quad (1)$$

where $I_{particle}$ is the captured intensity of light scattered by a particle, $E(\lambda)$ is spectral emission of light source 614 or the illumination system, $QE(\lambda)$ is a quantum efficiency of the imaging system 612, $G_d$ gain of the detection system, $R_p$ is a parameter characterizing both spectral and directional scattering/diffractive efficiency of particle 606. A false positive signal (i.e., ghost, stray light) can be described by:

$$I_{ghost} = \int_{\lambda_c-\delta\lambda}^{\lambda_c+\delta\lambda} E(\lambda) \times R_g \times G_d \times QE(\lambda) \quad (2)$$

where $I_{ghost}$ is the captured intensity of light scattered by gratings, $E(\lambda)$ is spectral emission of light source 614, $QE(\lambda)$ is a quantum efficiency of the imaging system 612, $G_d$ is gain of the detection system, $R_g$ is a parameter characterizing both spectral and directional scattering/diffractive efficiency of gratings and glass-air interface reflections. In other examples, illumination beam 604 may have a broadband profile and the detection system may have a narrow band detection. The signal from particle 602 and the false positive signal may also be described by equations (1) and (2) respectively.

Based on available data, parameter $R_p$ value can be estimated to be between about 10-5 to about 10-7. In one aspect, efficiency of two-dimensional diffractive grating is on the order of 10-2, so taking into account two diffraction events and one refraction on glass-air interface $R_g$ can be estimated to be about 10-6. Since integration ranges of equations (1) and (2) are equal, stray light generated by reticle pattern can be in least favorable case (particle efficiency of 10-7) one order of magnitude brighter from light scattered/diffracted by particles. In order to avoid stray light, spectral range of signal integration is selected such as coupling using mechanism presented in FIG. 5 is not possible.

Figure 7B:
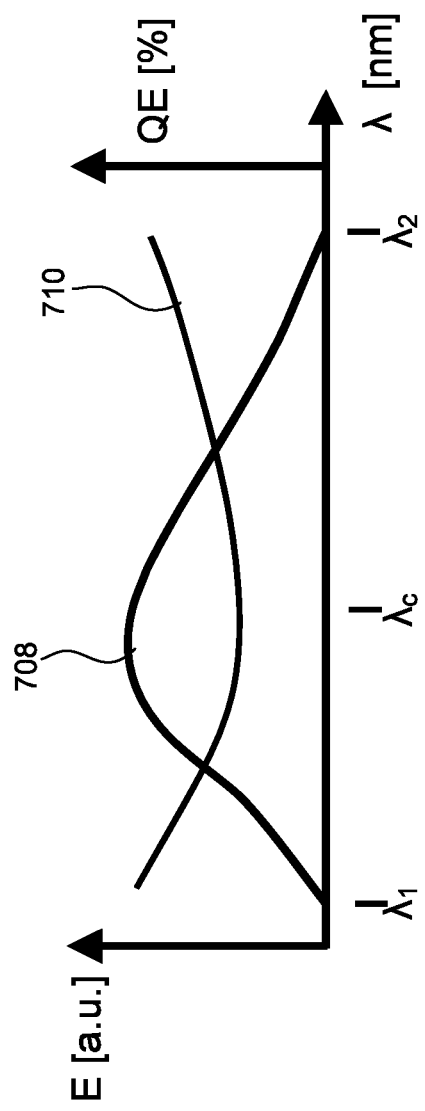
FIG. 7B shows a light emission profile for a broadband light source and a detector spectral characteristic, according to some embodiments.

In one aspect, illumination beam 604 is a broadband illumination beam having a continuous spectral range as shown in FIG. 7B.

FIG. 7B shows a light emission profile 710 for a broadband light source (e.g., illumination system 402 of FIG. 4) according to some embodiments. The detection system 612 of FIG. 6 has spectral characteristic profile 708. The detection system 612 may have a detection range from a first wavelength $\lambda_1$ to a second wavelength $\lambda_2$. Light emission profile 710 or spectrum includes at least wavelength range from the first wavelength $\lambda_1$ to second wavelength $\lambda_2$.

Referring back to FIG. 6, an intensity of a signal from particle 602 may be described by $$I'_{particle} = \int_{\lambda_1}^{\lambda_2} E(\lambda) \times R_P \times G_d \times QE(\lambda). \quad (3)$$

The intensity is driven by integration range, i.e. spectral extend of light source and spectral sensitivity of detector. Intensity of stray light or ghost is described by $$I_{ghost} = \int_{\lambda_c-\delta\Lambda}^{\lambda_c+\delta\Lambda} E(\lambda) \times R_g \times G_d \times QE(\lambda) \quad (4)$$

where $\lambda_c$ is a wavelength corresponding to the optimized wavelength and $\Lambda$ is a parameter associated with mutual spacing between the first diffractive pattern 608 and the second diffractive pattern 610. The intensity of the stray light signal is driven by diffractive gratings profile and mutual spacing between first diffractive pattern 608 and second diffractive pattern 610. Hence, the brightness of the diffractive gratings profile can be driven by efficiency of diffractive structures $R_g$. The intensity can be defined in narrow band wavelength range $\pm\delta\Lambda$ centered around $\lambda_c$.

Figure 8:
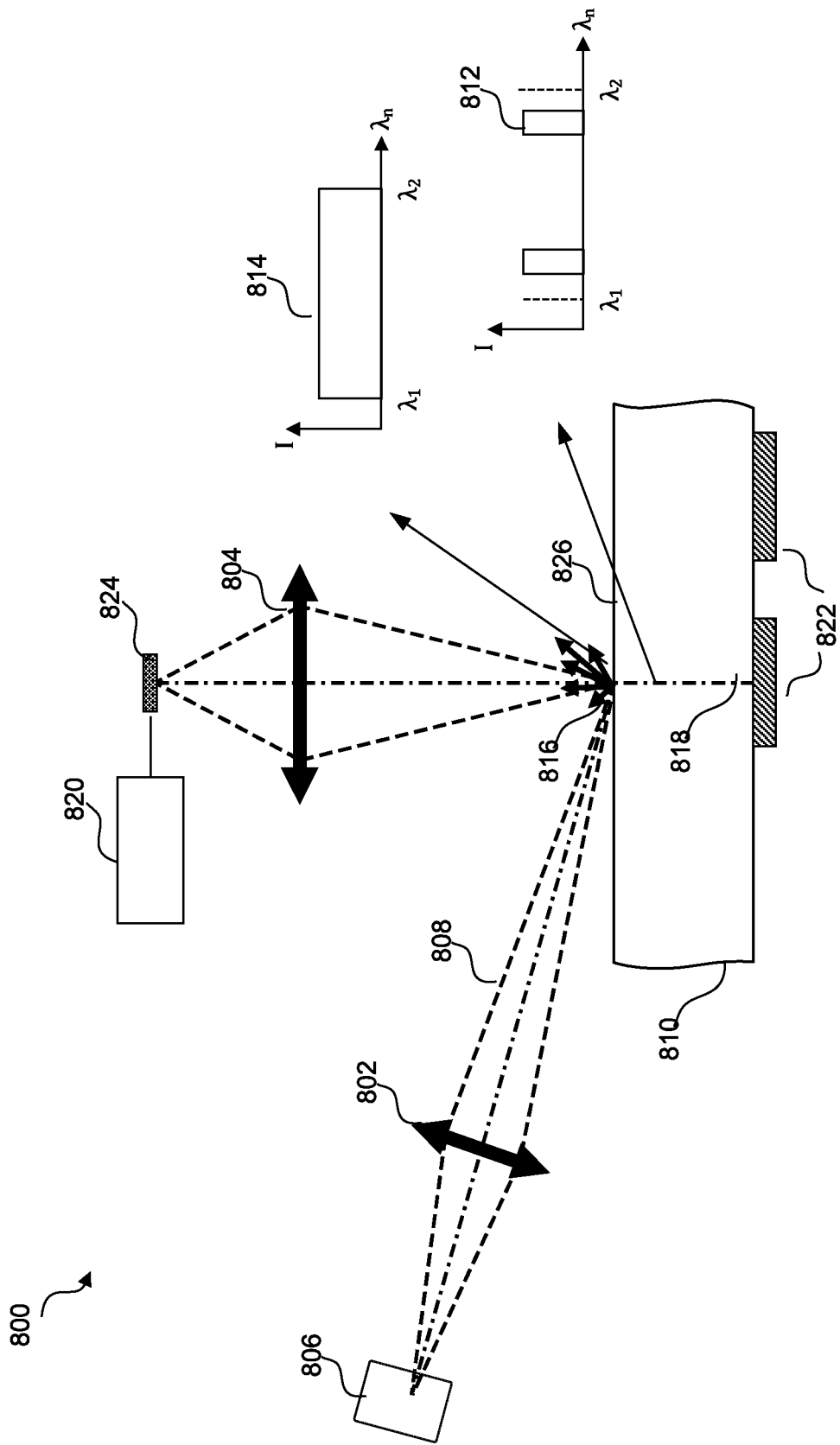
FIG. 8 shows a particle inspection system, according to some embodiments.

FIG. 8 shows a particle inspection system 800, according to some embodiments.

In some aspects, particle inspection system 800 includes an illumination system 802 and a detection system 804. Illumination system 802 may comprise a radiation source 806. In some embodiments, radiation source 806 may generate a broadband beam of radiation 808 to illuminate a reticle (object) 810. The reticle 810 may include a particle 816 and diffractive patterns 822. The detection system 804 includes a wavelength sensitive detector 824 (or sensing element). The detection system 804 determines an intensity profile of the scattered radiation as a function of a wavelength. The scattered radiation includes scattered radiation from particle 816 and stray light signal 818 (ghost signal).

Graph 812 shows an intensity profile of stray light signal 818 (e.g., signal due to diffractive patterns 820). Graph 814 shows an intensity profile of a particle signal (i.e., due to light scattered from particle 816).

Signals due to light scattered from particle 816 on surface 826 have an intensity profile corresponding to an intensity profile of radiation source 806. Stray light 818 redirected by diffractive patterns 822 have discrete quantized spectral content as shown by 812.

In some aspects, particle inspection system 800 also comprises a processor 820. Processor 820 of particle inspection system 800 can receive the intensity profile of the scattered radiation from the detection system 804. Processor 820 may compare the intensity profile of the scattered radiation with an intensity profile of the broadband illumination beam 808 generated by the illumination system 802. In one example, processor 820 may normalize both of the intensity profile of the scattered radiation and the intensity profile of broadband illumination beam 808. Then, processor 820 may compare a shape of the normalized intensity profile of the scattered radiation with the normalized intensity profile of the broadband illumination beam 808. In response to determining that the shape of the normalized intensity profile of the scattered radiation matches the normalized intensity profile of the broadband illumination beam, processor 820 may determine that the detected radiation is due to particle 816. In response to determining that the shape of the normalized profile of the scattered radiation does not match the normalized intensity profile of the broadband illumination beam profile, processor 820 determines that the scattered radiation is a false positive. The signal is then discarded. In some embodiments, processor 820 may determine a degree of confidence of a potential presence of particle 816 based on the comparison between the normalized intensity profile of the broadband illumination beam 808 and the normalized intensity profile of the scattered radiation (e.g., based on a match score).

Figure 9:
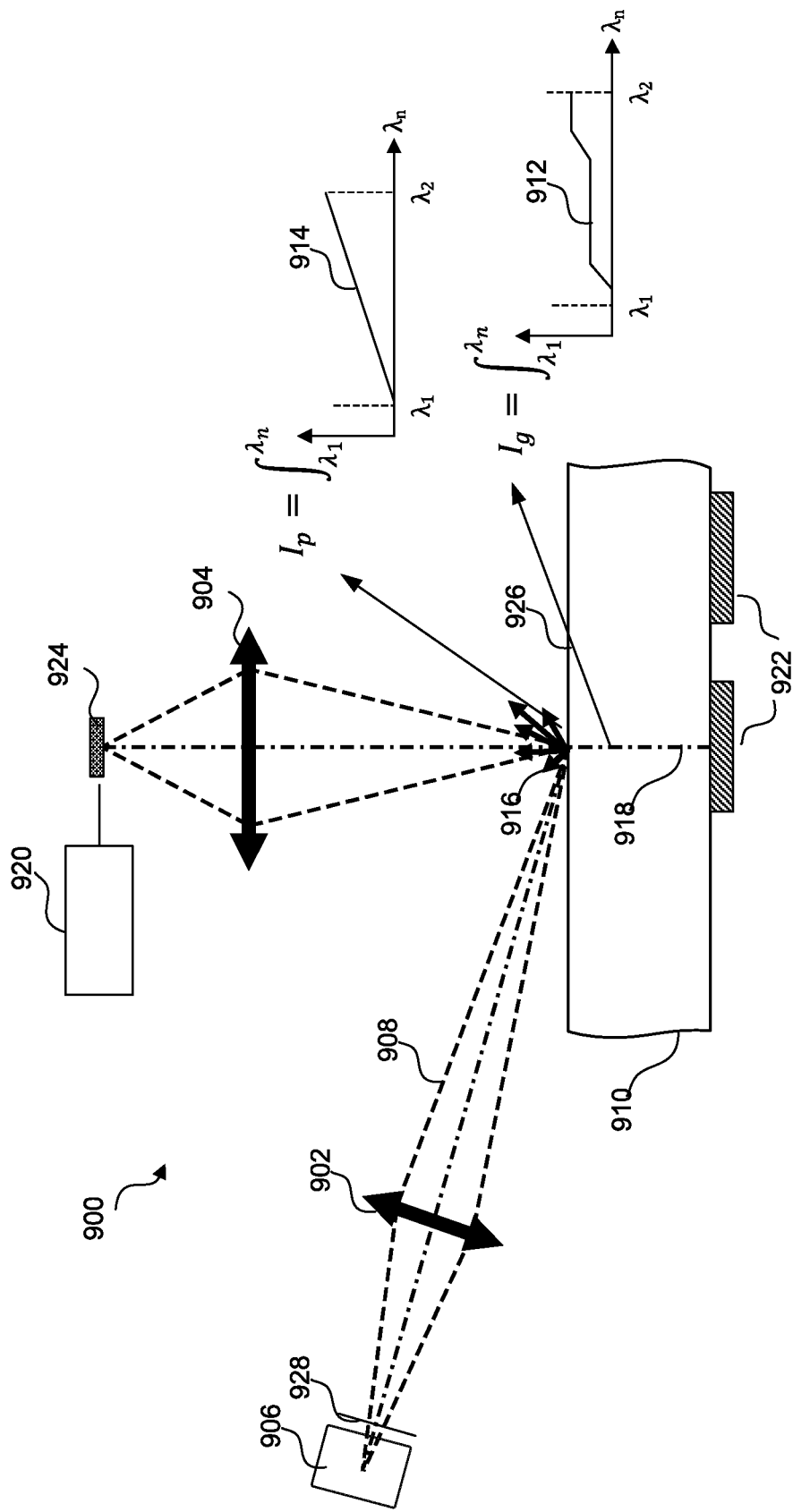
FIG. 9 shows a particle inspection system, according to some embodiments.

FIG. 9 shows a particle inspection system 900, according to some embodiments. The particle inspection system 900 includes an illumination system 902 and a detection system 904. Illumination system 902 may comprise a radiation source 906. In some embodiments, radiation source 906 may generate a broadband beam of radiation 908 (i.e., broadband illumination beam) to illuminate reticle (or object) 910. The reticle 910 may include a particle 916 and diffractive patterns 922. The detection system 904 includes a wavelength insensitive detector 924 (or monochromatic detector). The scattered radiation includes scattered radiation from particle 916 and stray light signal 918.

Graph 912 shows an intensity profile of a ghost signal 912. Graph 914 shows an intensity profile of a particle signal. As shown by graph 914, the intensity of the signal from particle 916 increases linearly with the increase of the spectral integration range. In other words, the intensity of the signal corresponding to scattering from particle 916 on surface 926 of the reticle 910 is proportional to a bandwidth of the continuous spectral range of the beam of radiation 908.

The particle inspection system also comprises a processor 920. Processor 920 receives the intensity of the scattered radiation from the detection system 904.

In one aspect, the illumination system 902 may temporally filter the broadband illumination beam or sequentially scan a wavelength of the illumination system 902 across the continuous spectral range. In other words, the beam of radiation 908 (illumination beam) may be tuned to specific narrow-band wavelengths (e.g., subrange of the continuous spectral range). In some embodiments, one or more spectral filters may be used to select one or more wavelengths of the radiation source. For example, a filter 928 may be included in the illumination system 902 to filter the broadband beam of radiation 908. Thus, a series of images may be acquired at different ranges of spectral integration. The signal due to particle 916 may be detected continuously during the tuning. On the contrary, signals from diffractive patterns 922 may not be detected continuously during the tuning because of the wavelength dependency of the signals as described previously herein. In one example, the images may be acquired continuously and the images are analyzed over time to identify changes in the images and signals. In another example, signals are integrated over the scan time. Then, the intensities at different regions are compared to distinguish between particles region and ghost region (ghost signal). Due to the integration over wide spectral range, particle signal is increasing steadily and is continuously rising while stray light signal (i.e., ghost signal) has increase only over discrete bands (i.e., otherwise the stray light signal is constant). In other words, a particle to ghost intensity ratio is increased. An image of the particle 916 is qualitatively improved.

Filter 928 may include two or more narrow band filters. For example, the illumination system includes one or more wavelength selective filters. In one aspect, filter 918 may be a tunable filter having a wavelength tuning range corresponding to a spectral range of the detection system 904. In one aspect, multiple tunable filters each having a different wavelength tuning subrange are used. Processor 920 controls the one or more tunable bandpass filters arranged to filter the broadband beam of radiation 908.

The tunable filter may be a liquid crystal tunable filter, an acousto-optical tunable filter, or the like as understood by one of ordinary skill in the art.

In one aspect, processor 920 analyzes a change in an optical response of the detection system 904 in response to the filtering. For example, processor 920 may compare the intensity of the detected radiation at various wavelengths. In response to determining that the intensity of the detected radiation varies in response to the filtering (e.g., diminishes or decreases when varying the wavelength), processor 920 may determine that the detected radiation is from a stray light or a ghost signal. Processor 920 may discard signals associated with stray light. In response to determining that the intensity of the detected radiation is substantially invariant in response to the filtering, processor 920 may determine that the detected radiation is from light scattered/diffracted by particle 916.

In one aspect, the radiation source 906 includes a tunable light source or one or more light sources that can be triggered in a sequential fashion. As the light source is tuned or during the sequential triggering of the one or more light sources, the change in the optical response of the detection system 904 is analyzed as described previously herein. The tunable light source or one or more light sources can be used in conjunction with the tunable filter or without a tunable filter.

In some embodiments, processor 920 may analyze the detection signal. The analysis may comprise frequency analysis. Processor 920 may determine properties of detected radiation, such as, e.g., modulation frequencies present in detected radiation and amplitude and/or phase corresponding to each of the modulation frequencies.

Figure 10A:
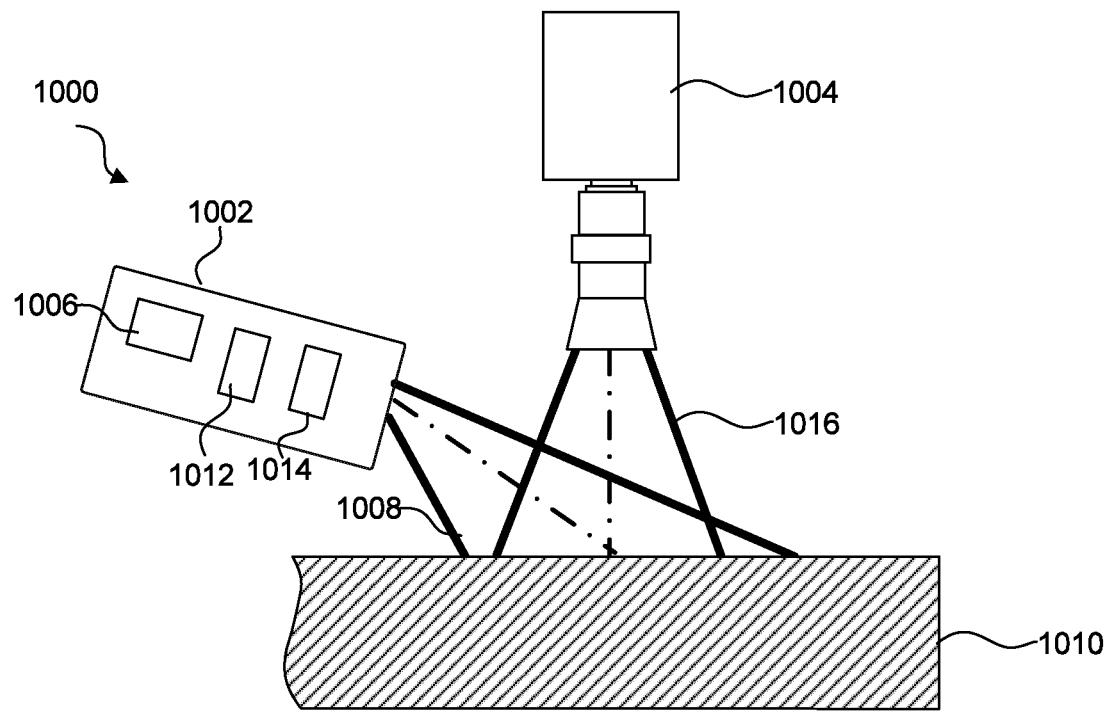
FIG. 10A shows a particle inspection system having a flat-top spectral sensitivity, according to some embodiments.

FIG. 10A shows a particle inspection system 1000, according to some embodiments. Particle inspection system 1000 includes an illumination system 1002 and a detection system 1004. Illumination system 1002 may comprise a radiation source 1006. In some embodiments, radiation source 1006 may generate a broadband beam of radiation 1008 to illuminate object 1010. Illumination system 1002 may comprise one or more radiation adjusting elements 1012 (e.g., any of polarizers, wavelength filters, focusing elements, beam splitters, beam combiners, and the like). Light emitted by the radiation source 1006 at different wavelength may have different intensity (e.g., profile 710 of FIG. 7B). In addition, the quantum efficiency of detection system 1004 may vary with the wavelength. For example, detection system 1004 may have a lower quantum efficiency for wavelengths near the limits of the detection range (e.g., at first wavelength $\lambda_1$, at second wavelength $\lambda_2$).

Figure 10B:
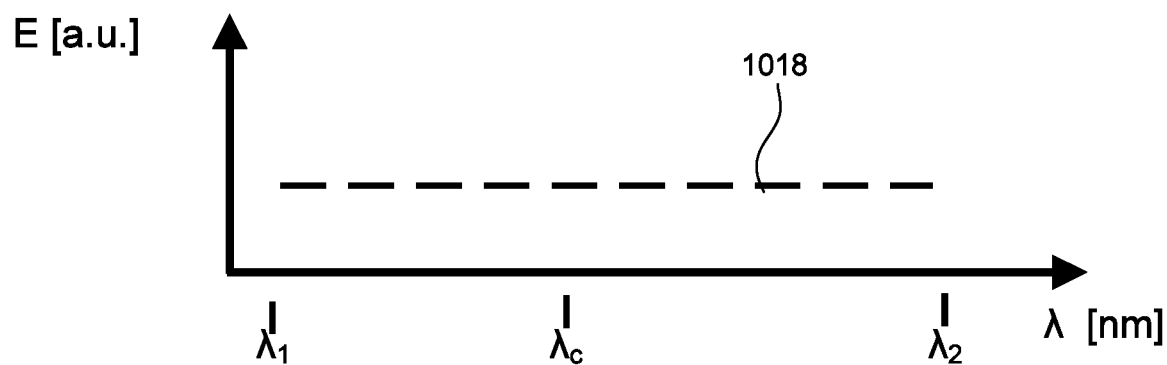
FIG. 10B shows a spectral sensitivity of a particle inspection system, according to some embodiments.

In one embodiment, the effective sensitivity to light of particle inspection system 1000 is wavelength independent. In other words, the particle inspection system 1000 has a flat-top spectral sensitivity. The spectral sensitivity 1018 of the particle inspection system 1000 is shown in FIG. 10B. Thus, regardless of an operating wavelength of particle inspection system 1000, the particle inspection system can have substantially equal sensitivity. Thus, the intensity of detected scattered signals from a particle on a surface of the object 1010 is constant across the continuous spectral range. The intensity of the ghost signal at a particular wavelength would be comparable to the intensity of the intensity of the detected scattered signal from the particle at the particular wavelength. Therefore, the ghost signal would appear dimmer compared to the integrated intensity of the detected scattered signal from the particle.

In one aspect, illumination system 1002 may comprise a spectral filter 1014 configured to match emission spectra of radiation source 1006 to quantum efficiency of the detection system 1004. Spectral filter 1014 may be a custom designed absorptive filter/gain filter.

Alternatively or additionally, a spectral filter may be inserted in the detection path 1016.

The spectral sensitivity of the particle inspection system is driven by lowest acceptable quantum efficiency (QE) of the detection system based on the application. Further, the spectral sensitivity is reduced with increased spectral range.

Figure 11:
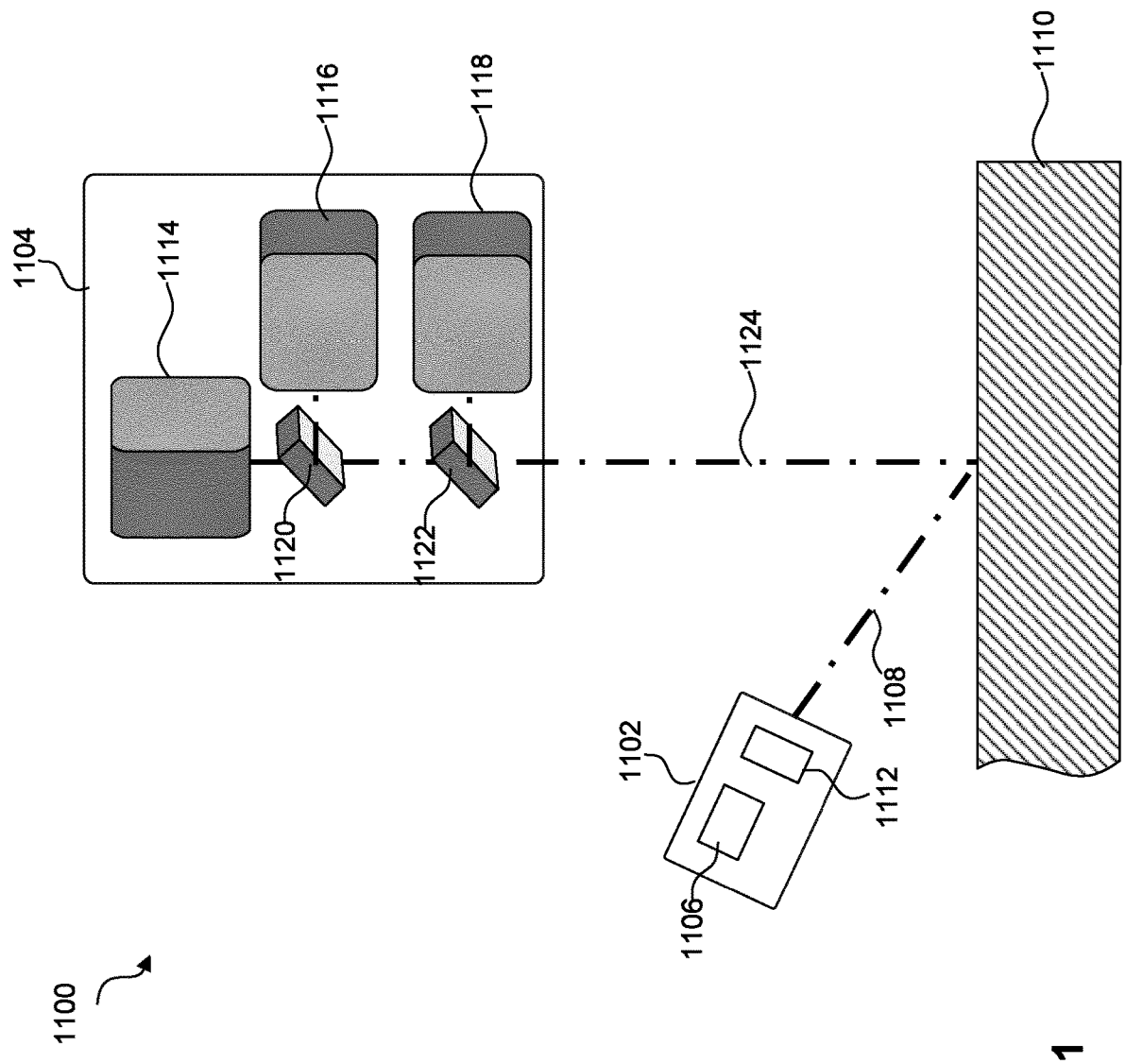
FIG. 11 shows a particle inspection system including a plurality of detectors, according to some embodiments.

FIG. 11 shows a particle inspection system 1100, according to some embodiments.

In one aspect, the particle inspection system 1100 includes an illumination system 1102 and a detection system 1104. Illumination system 1102 may comprise a radiation source 1106. In some embodiments, radiation source 1106 may generate a beam of radiation 1108 to illuminate object 1110. Detection system 1104 directs the scattered radiation 1124 to a plurality of detectors. Each detector of the plurality of detectors is sensitive to a different wavelength (or different subrange of wavelengths).

For example, the detection system 1104 may include a first detector 1114, a second detector 1116, and a third detector 1118. First detector 1114, second detector 1116, and third detector 1118 may have different detection ranges. First detector 1114 may be sensitive to light in a first range of wavelengths and not sensitive to radiation within the second and third range of wavelengths associated with second detector 1116 and third detector 1118. Detection system 1104 may include radiation redirecting elements 1120, 1122 configured to redirect a portion of the scattered radiation 1124 to each of first detector 1114, second detector 1116, and third detector 1118.

FIG. 12 shows a flow diagram of an inspection method 1200, according to some embodiments. It should be understood that the operations shown in method 1200 are not exhaustive and that other operations can be performed as well before, after, or between any of the illustrated operations. In various embodiments of the present disclosure, the operations of method 1200 can be performed in a different order and/or with different devices than those described as exemplary.

Operation 1202 includes irradiating a surface of an object with a broadband illumination beam having a continuous spectral range (e.g., beam of radiation 426 generated by radiation source 408). For example, the surface of the object may be a back side of lithographic patterning device or reticle 418 of FIG. 4.

Operation 1204 includes receiving scattered radiation at a detector. The scattered radiation includes radiation scattered from the surface and radiation scattered by a structure near the surface. This may be receiving scattered light scattered by particles or contaminants found on the back side of lithographic patterning device or reticle 418 of FIG. 4.

Operation 1206 includes generating a detection signal representative of an optical response to the broadband illumination signal based on the received scattered radiation at a detection system (e.g., detection system 404 of FIG. 4).

Operation 1208 includes analyzing the detection signal with processing circuitry (e.g. processor 406 of particle inspection system 400 of FIG. 4).

Operation 1210 includes distinguishing between a spurious signal and a signal corresponding to a defect (e.g., particle 422 of FIG. 4) on the surface of the lithographic patterning device based on the analyzing. The spurious signal is diminished for at least a portion of the continuous spectral range as described previously herein.

In some embodiments, there can be a modifying operation to the broadband illumination beam to produce a uniform spectral response across the continuous spectral range. For example, filter 1014 of FIG. 10A may be used to obtain the uniform spectral response 1018 shown in FIG. 10B.

In some embodiments, there can be a determining operation of an intensity profile of the scattered radiation as a function of a wavelength. For example, a wavelength sensitive detector may be used.

In some embodiments, there can be a distinguishing operation that includes comparing the intensity profile of the scattered radiation across the continuous spectral range with an intensity profile of the broadband illumination beam.

In some embodiments, there can be a filtering operation of the broadband illumination beam across the continuous spectral range when the detector is a wavelength insensitive detector. For example, a filter 920 of FIG. 9 may be used to tune or sequentially scan a wavelength of the broadband radiation illumination beam 908 across the continuous spectral range of the radiation source 906. Further, there can be an analyzing operation for detecting a change in the optical response in response to the filtering.

In some embodiments, there can be a directing operation of the scattered radiation to a plurality of single wavelength detectors, each single wavelength detector of the plurality of single wavelength detectors being sensitive to a different wavelength from the other detectors. Detection signals from each of the single wavelength detector may be analyzed to distinguish between a spurious signal and a signal corresponding to a defect. For example, a signal detected by two or more of the single wavelength detectors may be correspond to a signal from a defect.

In some embodiments, metrology systems described herein may be implemented in a larger system, for example, within a lithographic apparatus.

The embodiments may further be described using the following clauses:

1. An inspection system comprising:
    an illumination system configured to generate a broadband illumination beam having a continuous spectral range and to illuminate a surface of an object with the broadband illumination beam;
    a detection system configured to receive radiation scattered at the surface and by a structure near the surface and to generate a detection signal based on an optical response to the broadband illumination beam; and
    processing circuitry configured to
        analyze the detection signal, and
        distinguish between a spurious signal and a signal corresponding to a defect on the surface based on the analyzing, wherein the spurious signal is diminished for at least a portion of the continuous spectral range.
2. The inspection system of clause 1, further comprising:
    optics configured to modify the broadband illumination beam to produce a uniform response of the detection system across the continuous spectral range of the illumination system.
3. The inspection system of clause 1, wherein the detection system is a wavelength sensitive detection system and is further configured to determine an intensity profile of the scattered radiation as a function of a wavelength.
4. The inspection system of clause 3, wherein the distinguishing includes comparing the intensity profile of the scattered radiation across the continuous spectral range with an intensity profile of the broadband illumination beam.
5. The inspection system of clause 4, wherein an intensity profile of the signal corresponding to the defect on the surface corresponds the intensity profile of the broadband illumination beam.
6. The inspection system of clause 1, wherein the detection system is a wavelength insensitive detection system.
7. The inspection system of clause 6, wherein
    the illumination system is further configured to temporally filter the broadband illumination beam across the continuous spectral range; and
    the analyzing includes an analysis of a change in the optical response in response to the filtering.
8. The inspection system of clause 7, wherein the illumination system includes one or more wavelength selective filters.
9. The inspection system of clause 7, wherein the illumination system further includes a tunable filter.
10. The inspection system of clause 6, wherein an intensity of the signal corresponding to the defect on the surface is proportional to a bandwidth of the continuous spectral range.
11. The inspection system of clause 1, wherein the detection system is further configured to direct the scattered radiation to a plurality of single wavelength detectors, each single wavelength detector of the plurality of single wavelength detectors being sensitive to a different wavelength from the other single wavelength detectors.
12. The inspection system of clause 1, wherein the continuous spectral range of the illumination system corresponds to a spectral range of the detection system.
13. An inspection method comprising:
    irradiating a surface of an object with a broadband illumination beam having a continuous spectral range;
    receiving scattered radiation at a detector, the scattered radiation including radiation scattered from the surface and radiation scattered by a structure near the surface;
    generating a detection signal representative of an optical response to the broadband illumination signal based on the received scattered radiation;
    analyzing the detection signal; and
    distinguishing between a spurious signal and a signal corresponding to a defect on the surface based on the analyzing, wherein the spurious signal is diminished for at least a portion of the continuous spectral range.
14. The inspection method of clause 13, further comprising:
    modifying the broadband illumination beam to produce a uniform response across the continuous spectral range.
15. The inspection method of clause 13, wherein the detector is a wavelength sensitive detector, and
    the method further comprising determining an intensity profile of the scattered radiation as a function of a wavelength.
16. The inspection method of clause 15, wherein the distinguishing includes comparing the intensity profile of the scattered radiation across the continuous spectral range with an intensity profile of the broadband illumination beam.
17. The inspection method of clause 13, wherein the detector is a wavelength insensitive detector.
18. The inspection method of clause 17, further comprising:

temporally filtering the broadband illumination beam across the continuous spectral range; and
analyzing a change in the optical response in response to the filtering.

19. The inspection method of clause 11, further comprising:
directing the scattered radiation to a plurality of single wavelength detectors, each single wavelength detector of the plurality of single wavelength detectors being sensitive to a different wavelength from the other detectors.

20. A lithography apparatus comprising:
an illumination apparatus configured to illuminate a pattern of a patterning device;
a projection system configured to project an image of the pattern onto a substrate; and
a metrology system including
an illumination system configured to generate a broadband illumination beam having a continuous spectral range and to illuminate a surface of an object with the broadband illumination beam,
a detection system configured to receive radiation scattered at the surface and by a structure near the surface and to generate a detection signal based on an optical response to the broadband illumination beam, and
processing circuitry configured to
analyze the detection signal, and
distinguish between a spurious signal and a signal corresponding to a defect on the surface based on the analyzing, wherein the spurious signal is diminished for at least a portion of the continuous spectral range.

21. An inspection system comprising:
an illumination system configured to generate an illumination beam and to illuminate a surface of an object with the illumination beam, the illumination beam having a wavelength scanned spectrally across a continuous spectral range;
a detection system configured to receive radiation scattered at the surface and by a structure near the surface and to generate a detection signal based on the received scattered radiation; and
processing circuitry configured to
analyze temporal values of an intensity of the detection signal across the continuous spectral range, and
distinguish between a spurious signal and a signal corresponding to a defect on the surface based on the analyzing, wherein the spurious signal is diminished for at least a portion of the continuous spectral range.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the present disclosure have been described above, it will be appreciated that the present disclosure can be practiced otherwise than as described. The description is not intended to limit the present disclosure.

It is to be appreciated that the Detailed Description section, and not the Summary and Abstract sections, is intended to be used to interpret the clauses. The Summary and Abstract sections may set forth one or more but not all exemplary embodiments of the present disclosure as contemplated by the inventor(s), and thus, are not intended to limit the present disclosure and the appended clauses in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of protected subject matter should not be limited by any of the above-described exemplary embodiments, but should be defined only in accordance with the following claims and their equivalents.

The invention claimed is:

1. An inspection system comprising:
an illumination system configured to generate a broadband illumination beam having a continuous spectral range and to illuminate a surface of an object with the broadband illumination beam;
a detection system configured to receive radiation scattered at the surface and by a structure near the surface and to generate a detection signal based on an optical response to the broadband illumination beam; and
processing circuitry configured for:
analyzing the detection signal, and
distinguishing, based on the analyzing, between a spurious signal corresponding to one or more internal reflections from the structure and a defect signal corresponding to a defect on the surface,
wherein the spurious signal is diminished for at least a portion of the continuous spectral range.

2. The inspection system of claim 1, further comprising:
optics configured to modify the broadband illumination beam to produce a uniform response of the detection system across the continuous spectral range of the illumination system.

3. The inspection system of claim 1, wherein the detection system is a wavelength sensitive detection system and is further configured to determine an intensity profile of the scattered radiation as a function of a wavelength.

4. The inspection system of claim 3, wherein the distinguishing includes comparing the intensity profile of the scattered radiation across the continuous spectral range with an intensity profile of the broadband illumination beam.

5. The inspection system of claim 4, wherein an intensity profile of the defect signal corresponds to the intensity profile of the broadband illumination beam.

6. The inspection system of claim 1, wherein the detection system is a wavelength insensitive detection system.

7. The inspection system of claim 6, wherein:
the illumination system is further configured to temporally filter the broadband illumination beam across the continuous spectral range; and
the analyzing includes an analysis of a change in the optical response in response to the filtering.

8. The inspection system of claim 7, wherein the illumination system includes one or more wavelength selective filters.

9. The inspection system of claim 7, wherein the illumination system further includes a tunable filter.

10. The inspection system of claim 6, wherein an intensity of the defect signal is proportional to a bandwidth of the continuous spectral range.

11. The inspection system of claim 1, wherein the detection system is further configured to direct the scattered radiation to a plurality of single wavelength detectors, each single wavelength detector of the plurality of single wavelength detectors being sensitive to a different wavelength from the other single wavelength detectors.

12. The inspection system of claim 1, wherein the continuous spectral range of the illumination system corresponds to a spectral range of the detection system.

13. An inspection method comprising:
irradiating a surface of an object with a broadband illumination beam having a continuous spectral range;
receiving scattered radiation at a detector, the scattered radiation including radiation scattered from the surface and radiation scattered by a structure near the surface;
generating a detection signal representative of an optical response to the broadband illumination beam based on the received scattered radiation;
analyzing the detection signal; and
distinguishing, based on the analyzing, between a spurious signal corresponding to one or more internal reflections from the structure and a defect signal corresponding to a defect on the surface, wherein the spurious signal is diminished for at least a portion of the continuous spectral range.

14. The inspection method of claim 13, further comprising:
modifying the broadband illumination beam to produce a uniform response across the continuous spectral range.

15. The inspection method of claim 13, wherein the detector is a wavelength sensitive detector, and the method further comprises:
determining an intensity profile of the scattered radiation as a function of a wavelength.

16. The inspection method of claim 15, wherein the distinguishing includes comparing the intensity profile of the scattered radiation across the continuous spectral range with an intensity profile of the broadband illumination beam.

17. The inspection method of claim 13, wherein the detector is a wavelength insensitive detector.

18. The inspection method of claim 17, further comprising:
temporally filtering the broadband illumination beam across the continuous spectral range; and
analyzing a change in the optical response in response to the filtering.

19. The inspection method of claim 13, further comprising:
directing the scattered radiation to a plurality of single wavelength detectors, each single wavelength detector of the plurality of single wavelength detectors being sensitive to a different wavelength from the other single wavelength detectors.

20. A lithography apparatus comprising:
an illumination apparatus configured to illuminate a pattern of a patterning device;
a projection system configured to project an image of the pattern onto a substrate; and
a metrology system comprising:
an illumination system configured to generate a broadband illumination beam having a continuous spectral range and to illuminate a surface of an object with the broadband illumination beam,
a detection system configured to receive radiation scattered at the surface and by a structure near the surface and to generate a detection signal based on an optical response to the broadband illumination beam, and
processing circuitry configured for:
analyzing the detection signal, and
distinguishing, based on the analyzing, between a spurious signal corresponding to one or more internal reflections from the structure and a defect signal corresponding to a defect on the surface, wherein the spurious signal is diminished for at least a portion of the continuous spectral range.

21. The inspection system of claim 1, wherein the spurious signal is diminished for at least a portion of the continuous spectral range as compared to the defect signal.

* * * * *

UNITED STATES PATENT AND TRADEMARK OFFICE
CERTIFICATE OF CORRECTION

PATENT NO. : 12,442,759 B2  
APPLICATION NO. : 17/918317  
DATED : October 14, 2025  
INVENTOR(S) : Pawlowski et al.

Page 1 of 1

It is certified that error appears in the above-identified patent and that said Letters Patent is hereby corrected as shown below:

On the Title Page

Item [57], Line 5, delete "surface" and replace with -- a surface --.

Signed and Sealed this  
Ninth Day of December, 2025

John A. Squires  
*Director of the United States Patent and Trademark Office*